(12) United States Patent
Guidash (10) Patent No.: US 7,705,900 B2
(45) Date of Patent: Apr. 27, 2010

(54) CMOS IMAGE SENSOR PIXEL WITH SELECTABLE BINNING AND CONVERSION GAIN

(75) Inventor: R. Michael Guidash, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 705 days.

(21) Appl. No.: 11/408,640

(22) Filed: Apr. 21, 2006

(65) Prior Publication Data

US 2006/0274176 A1 Dec. 7, 2006

Related U.S. Application Data

(60) Provisional application No. 60/686,104, filed on Jun. 1, 2005.

(51) Int. Cl.
*H04N 3/14* (2006.01)
*H01L 27/00* (2006.01)
*H01L 31/062* (2006.01)

(52) U.S. Cl. ............... 348/308; 348/300; 348/301; 250/208.1

(58) Field of Classification Search ............. 348/308, 348/300, 301, 302; 257/204, 69, E27.046, 257/E27.064, E27.108, E21.632, 80, 84, 257/291; 250/208.1, 214.1; 438/199
See application file for complete search history.

(56) References Cited

U.S. PATENT DOCUMENTS

| | | | | |
|---|---|---|---|---|
| 6,452,153 | B1* | 9/2002 | Lauxtermann et al. | 250/208.1 |
| 6,878,918 | B2* | 4/2005 | Dosluoglu | 250/208.1 |
| 7,091,466 | B2* | 8/2006 | Bock | 250/208.1 |
| 2003/0010896 | A1* | 1/2003 | Kaifu et al. | 250/208.1 |
| 2005/0012836 | A1* | 1/2005 | Guidash | 348/302 |
| 2005/0185077 | A1* | 8/2005 | Xiao | 348/302 |
| 2006/0273240 | A1* | 12/2006 | Guidash et al. | 250/208.1 |

FOREIGN PATENT DOCUMENTS

| | | |
|---|---|---|
| EP | 1 102 323 A1 | 5/2001 |
| EP | 1 271 930 A2 | 1/2003 |
| EP | 1 467 410 A2 | 10/2004 |
| WO | WO 2005/107235 A1 | 11/2005 |

OTHER PUBLICATIONS

1. Z. Zhou et al, "Frame-transfer CMOS active pixel sensor with pixel binning", IEEE Transactions on Electron Devices, vol. 44, No. 10, pp. 1764-1768 (Oct. 1997).*

* cited by examiner

*Primary Examiner*—Tuan Ho
*Assistant Examiner*—Marly Camargo
(74) *Attorney, Agent, or Firm*—Peyton C. Watkins; Nancy R. Simon (57) ABSTRACT

An image sensor includes a plurality of pixels, at least two pixels each having a photodetector; a charge-to-voltage conversion region; an input to an amplifier; and a switch for selectively connecting the charge-to-voltage conversion regions.

33 Claims, 11 Drawing Sheets

Note:
Blue number is row address
Red number is col address

CMOS IMAGE SENSOR PIXEL WITH SELECTABLE BINNING AND CONVERSION GAIN

CROSS-REFERENCE TO RELATED APPLICATIONS

This is a 111A application of Provisional Application Ser. No. 60/686,104, filed Jun. 1, 2005.

FIELD OF THE INVENTION

The invention relates generally to the field of image sensors, and more particularly, to image sensors having pixels that can selectively combine charge-to-voltage conversion regions.

BACKGROUND OF THE INVENTION

Figure 1:
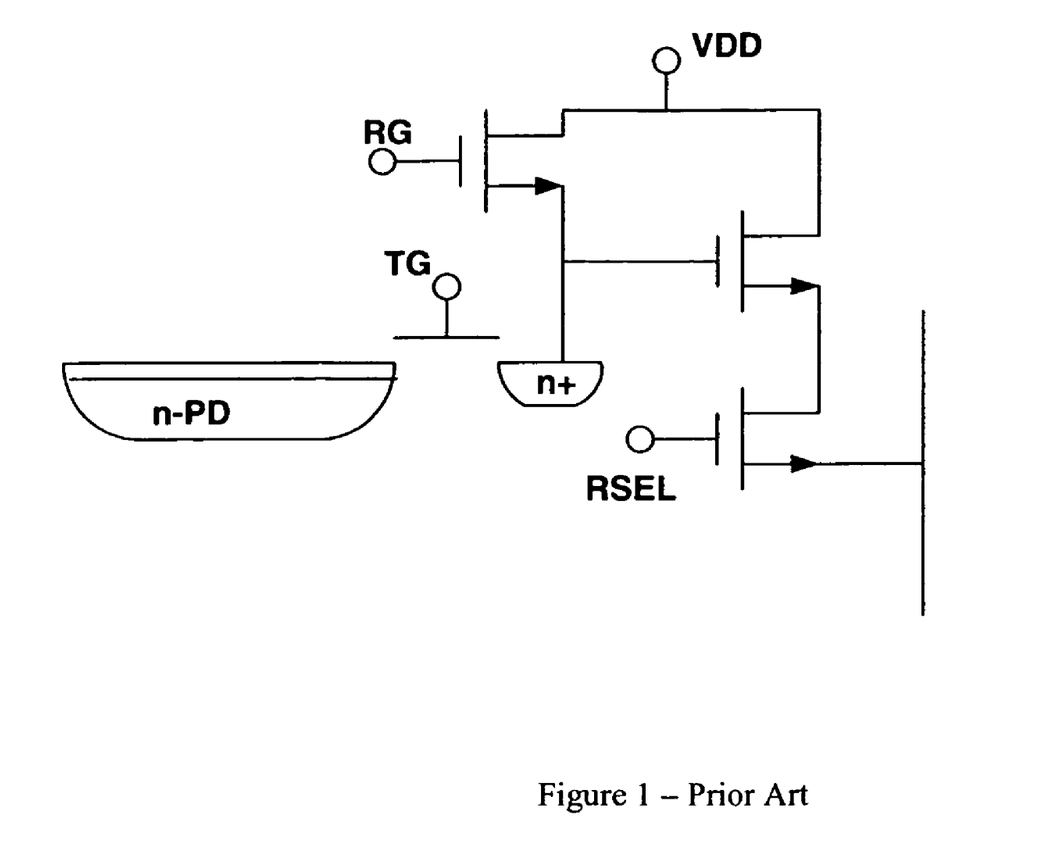
FIG. 1 is a prior art pixel of an active pixel image sensor.
Figure 2:
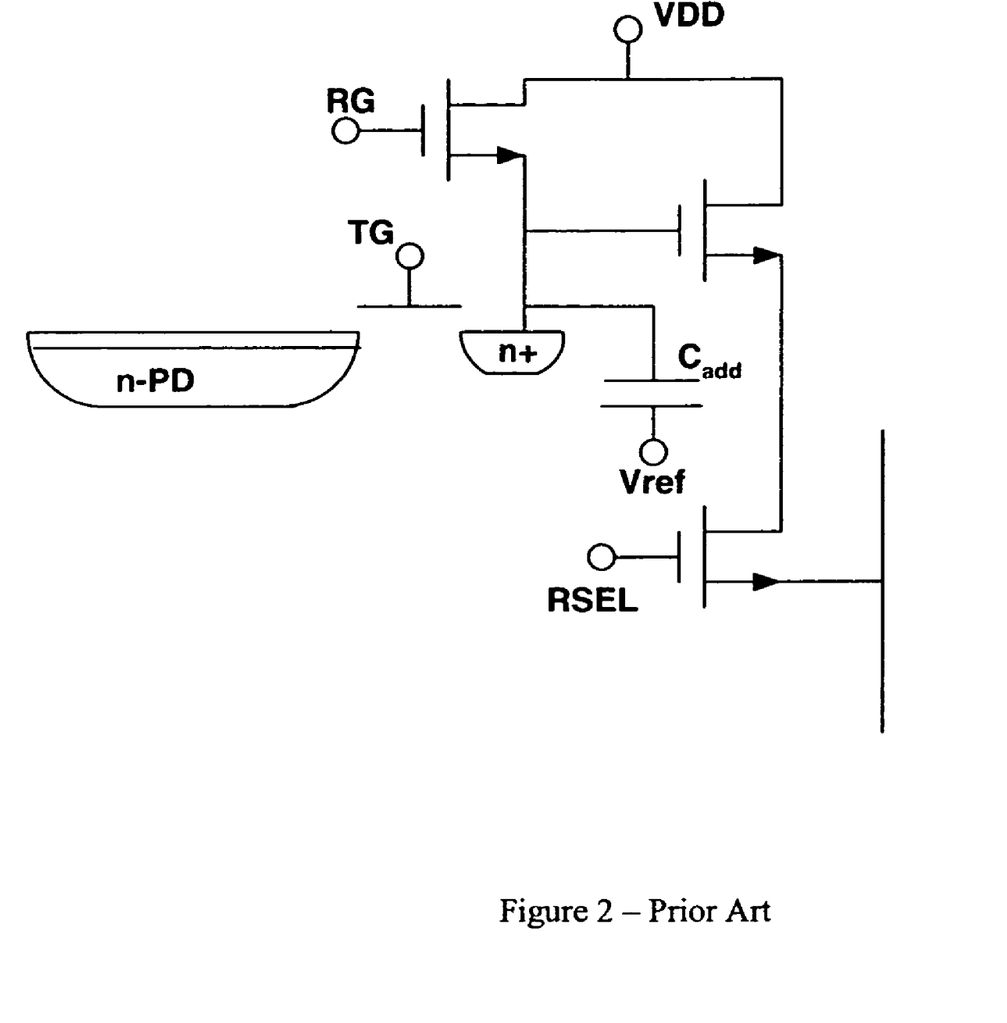
FIG. 2 is a prior art pixel of an image sensor having increased capacitance for the floating diffusion.
Figure 3:
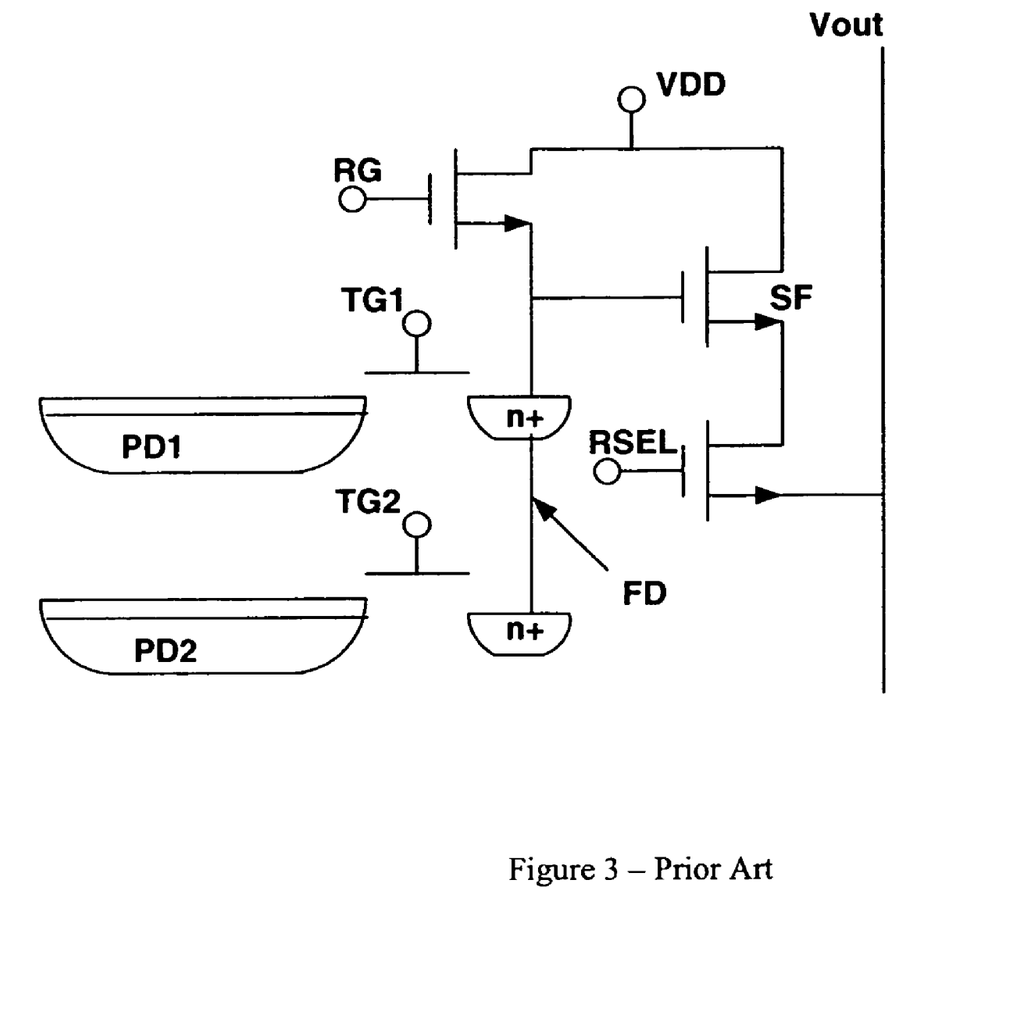
FIG. 3 is a prior art pixel of an image sensor having a shared amplifier.

Prior art CMOS Active Pixel Sensor pixel architectures are shown in FIGS. 1, 2 and 3. Referring to FIG. 1, this four-transistor pixel has a photodetector n-PD and a charge-to-voltage conversion region $n^+$ in each pixel. This architecture provides the some advantages. The first advantage is global shutter operation by using the charge-to-voltage conversion region $n^+$ as a storage region. The second advantage is pixel symmetry. Each pixel is identical which provides identical photoresponse for each pixel. This pixel architecture also has disadvantages. A first disadvantage is that for large pixel sizes, the capacitance of the charge-to-voltage conversion region can be too small to hold all of the charge that is accumulated in the photodetector. A second disadvantage is lack of in-pixel charge domain binning.

The pixel shown in FIG. 2 addresses the first disadvantage. The charge-to-voltage conversion region capacitance is increased by incorporation of an added capacitance $C_{add}$ in each pixel. While this solves the charge-to-voltage conversion region capacitance, and can provide a more linear output response, it has the disadvantage of reducing the fill factor of the pixel due to the area in the pixel allocated to the added capacitance $C_{add}$. The reduced fill factor, adversely affects the charge capacity and dynamic range of the pixel.

The pixel shown in FIG. 3 solves the disadvantages of lack of charge domain binning capability, low charge-to-voltage region capacitance, and low fill factor by sharing the charge-to-voltage conversion $n^+$ between adjacent pixels. This pixel architecture has other disadvantages. A first disadvantage is pixel symmetry. Each pixel is not identical, and this can lead to systematic differences in photoresponse, causing fixed pattern noise that can degrade image quality. A second disadvantage is lack of global shutter capability. Since the charge-to-voltage conversion region is shared by adjacent pixels, it cannot be used as a charge storage region to isolate the signal captured by individual photodetectors.

Consequently, a need exits for an image sensor that overcomes the above-described drawbacks.

SUMMARY OF THE INVENTION

The present invention is directed to overcoming one or more of the problems set forth above. Briefly summarized, according to one aspect of the present invention, the invention resides in an image sensor comprising a plurality of pixels, at least two pixels each comprising: (a) a photodetector; (b) a charge-to-voltage conversion region; (c) an input to an amplifier; and a switch for selectively connecting the charge-to-voltage conversion regions.

These and other aspects, objects, features and advantages of the present invention will be more clearly understood and appreciated from a review of the following detailed description of the preferred embodiments and appended claims, and by reference to the accompanying drawings.

Advantageous Effect of the Invention

The present invention discloses a CMOS active pixel having the advantages of: (a) single four-transistor operation with global shutter; (b) selectable conversion gain by use of components in adjacent pixels; (c) selectable charge domain binning in both the vertical or horizontal direction; (d) higher data rate for reduced resolution readout; and (e) pixel symmetry since all pixels are identical.

DETAILED DESCRIPTION OF THE INVENTION

Before discussing the invention in detail, it is instructive to clearly define CMOS active pixel sensor. CMOS refers to complimentary metal oxide silicon transistors in which complimentary means there are two transistors operating together which are composed of different dopants, one of n-type dopant and one of p-type dopant. The n-type dopant transistor is referred to as NMOS, and the p-type dopant transistor is referred to as PMOS. Active pixel sensors refer to electronic image sensors with active devices, such as transistors, that are associated with each pixel.

Figure 4:
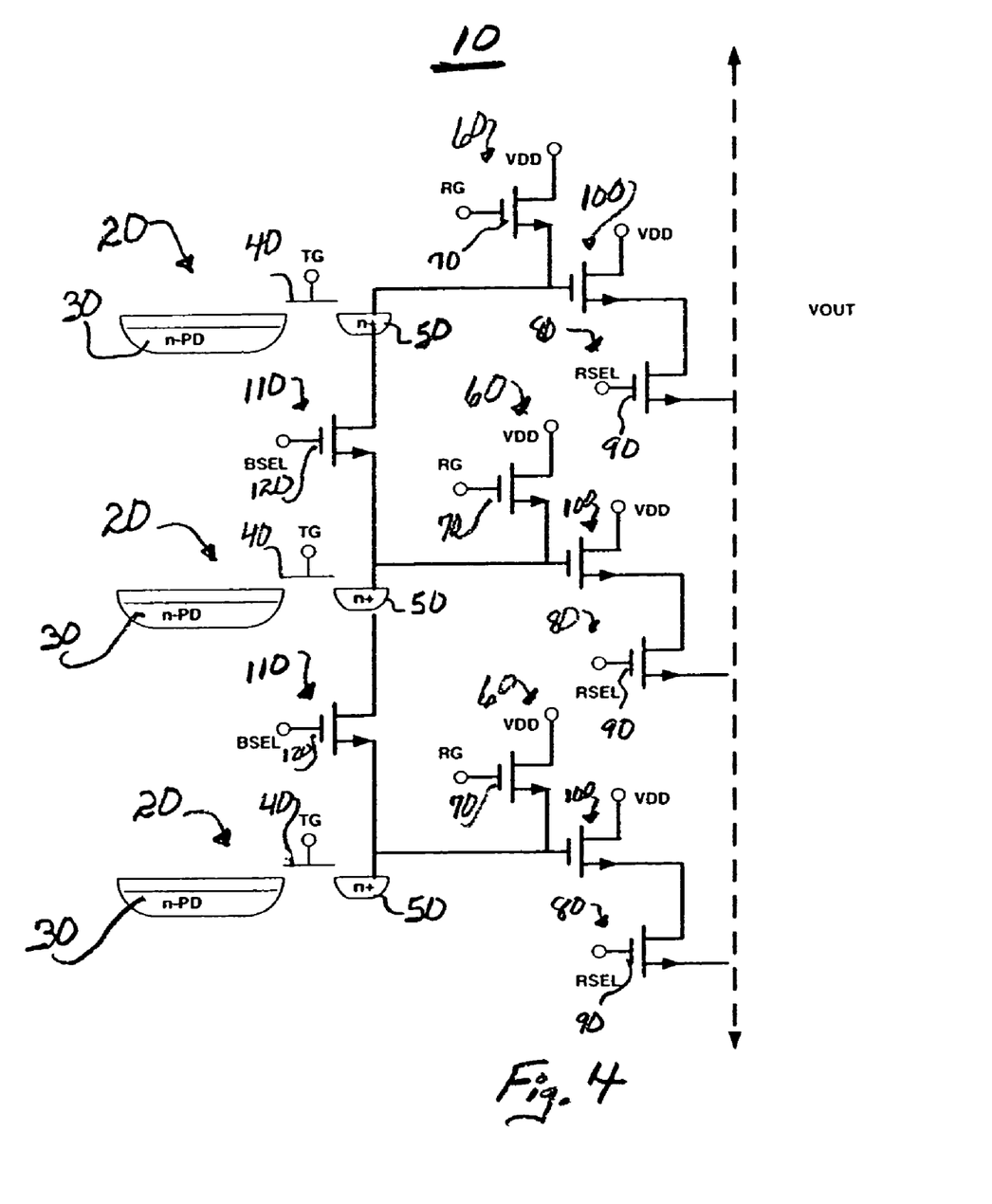
FIG. 4 is a schematic drawing of a first embodiment of the present invention illustrating a five-transistor pixel that provides programmable conversion gain and binning by selective connection of charge-to-voltage conversion regions in the vertical direction.

Now referring to FIG. 4, the CMOS active pixel image sensor 10 of the present invention is shown one embodiment of the present invention that enables charge domain binning in a selectable manner. As seen in FIG. 1, this is in its simplest embodiment a five-transistor pixel. Each pixel 20 includes a photodetector 30, preferably an n-type photodetector for capturing incident light that is converted into charge. A transfer gate 40 is pulsed to pass the charge from the photodetector 30 to a floating diffusion 50, whose signal varies according to the amount of received charge. A reset transistor 60 with a reset gate 70 is pulsed to reset the charge on the floating diffusion 50, and a row select transistor 80 with a row select gate 90 is pulsed to select the particular row of the pixel array. A source follower input transistor 100 senses the voltage on the floating diffusion 50 and amplifies it. A plurality of "bin select" transistors 110 each with a bin select gate 120 may be addressed in any desired combination to electrically connect adjacent floating diffusion regions 50 thus providing the ability to combine charge from adjacent floating diffusions 50. For example, the charge from two floating diffusions 50 may be combined or the charge from all three floating diffusions 50 may be combined. This configuration is referred to as vertical binning.

The design of FIG. 4 is referred to as a five-transistor, non-shared pixel (5TNS). The benefits of this pixel architecture are: (1) pixels which are identical so fixed pattern noise associated with layout differences is mitigated; (2) charge domain binning can be accomplished by turning on bin select to connect adjacent floating diffusions; (3) variable charge-to-voltage conversion for a single pixel readout can be accomplished by timing of the bin select and row select addresses; and (4) charge domain binning is configurable rather than being hardwired.

Figure 5:
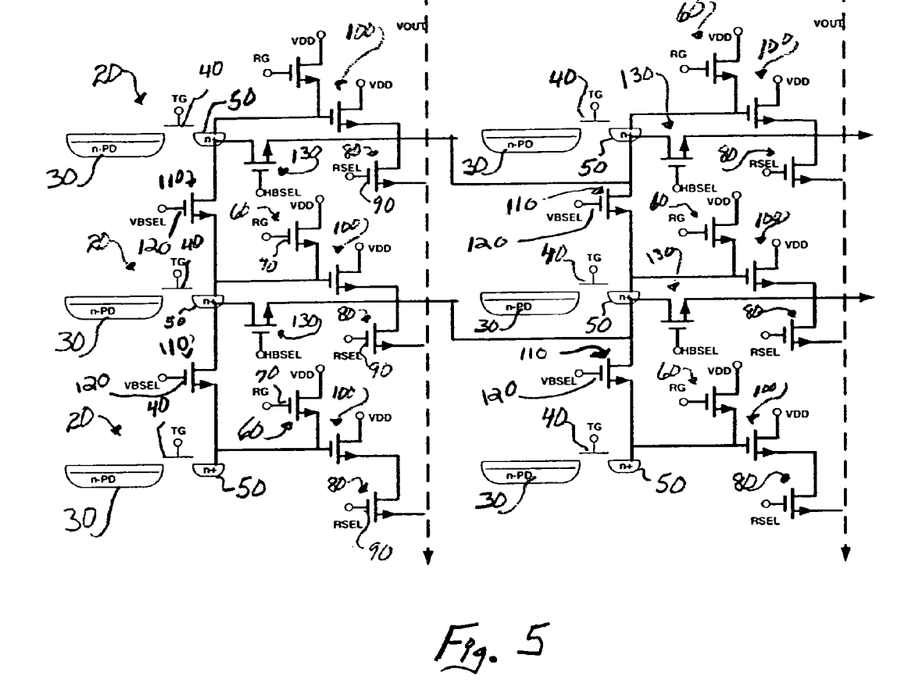
FIG. 5 is a schematic drawing of a second embodiment of the present invention illustrating a five-transistor pixel that provides programmable conversion gain and binning by selective connection of charge-to-voltage conversion regions in the horizontal and vertical direction.

Referring to FIG. 5, horizontal bin selection can also be accomplished by addition of a horizontal bin selection transistor (HBSEL) 130, hereinafter referred to as a six-transistor device. In this embodiment, the additional transistor 130 permits horizontal binning by a plurality of floating diffusions 50. In this embodiment the BSEL transistor 110 described in FIG. 4 is referred to and labeled as a vertical bin selection transistor VBSEL 110 to denote selective connection of row adjacent floating diffusions 50. Again, the number of floating diffusions 50 that are binned are determined by the number of floating diffusions 50 that are connected through the one or more horizontal bin selects 130. It is noted for clarity that the vertical bin selection transistors 110 are connected as discussed hereinabove for vertical binning.

Figure 6:
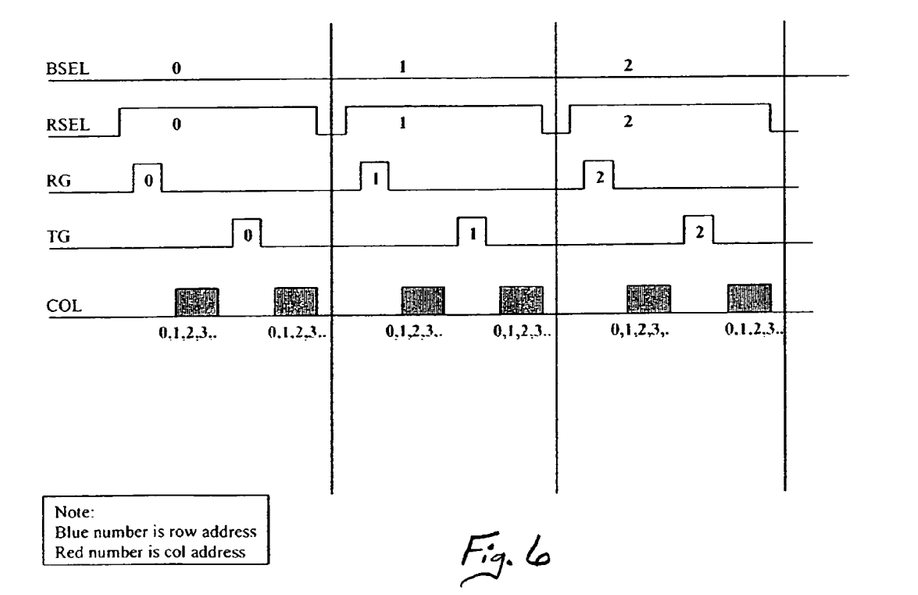
FIG. 6 is a timing diagram for FIG. 1 for the case of no charge-to-voltage conversion regions connected together.

Referring to FIG. 6, there is shown a timing diagram for FIG. 4 in which no BSEL transistors 110 are turned on so that the floating diffusions are not connected together.

Figure 7:
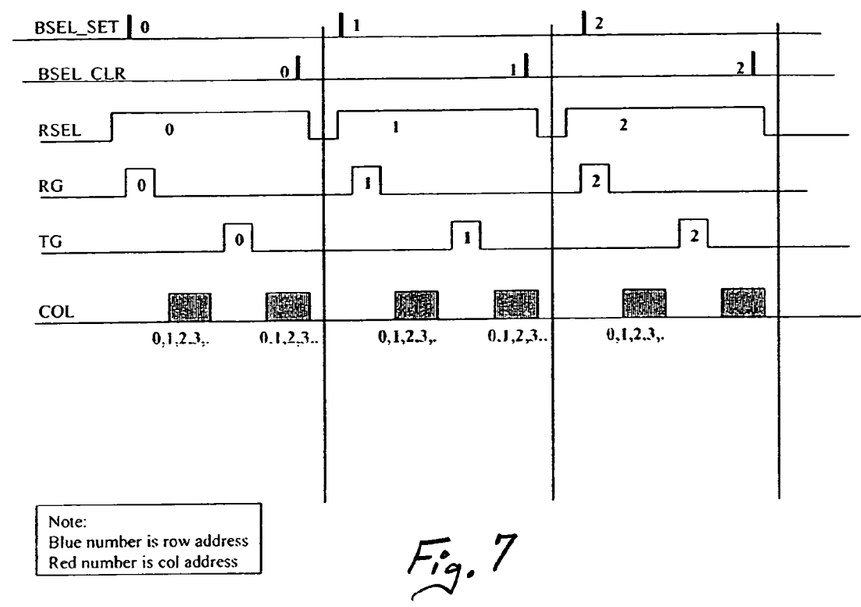
FIG. 7 is a timing diagram for FIG. 1 for the case of two adjacent charge-to-voltage conversion regions connected together.

Referring to FIG. 7, there is shown the timing diagram for FIG. 4 in which the vertically adjacent floating diffusions 50 are connected together. As a result, the BSEL transistor 10 for the row being addressed and readout is turned on so that the floating diffusion 50 of the row being readout and an adjacent row are connected together to form a single floating diffusion sense node. In this configuration, the conversion gain is reduced and the floating diffusion 50 capacitance and charge capacity is increased. The increased charge capacity for readout of a single photodiode 30 is desired for large pixel sensors where the charge capacity of the photodiode 30 is large and the floating diffusion 50 capacitance is too small to handle the photodiode capacity. The increased floating diffusion 50 capacity is accomplished without having to integrate a large capacitance in each pixel 20.

Figure 8:
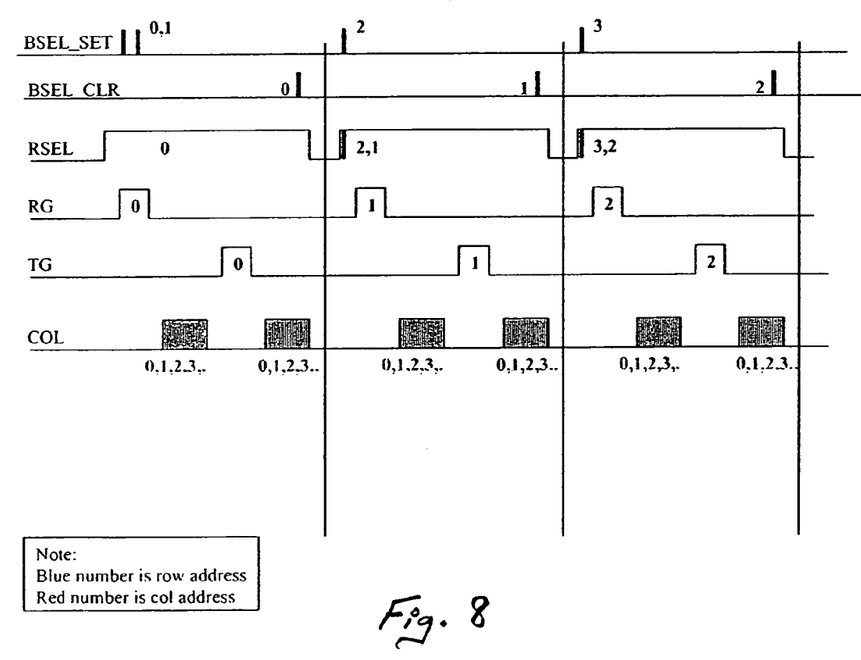
FIG. 8 is a timing diagram for FIG. 1 for the case of three charge-to-voltage conversion regions connected together.

The timing diagram for connecting three row adjacent floating diffusions 50 together is shown in FIG. 8. In this case, two BSEL transistors 110 are turned on, the row being addressed and an adjacent row, so that the floating diffusion 50 of the row being readout and two adjacent rows are connected together to form a single floating diffusion sense node. In this configuration, the conversion gain is reduced further and the floating diffusion charge capacity is increased further.

Figure 9:
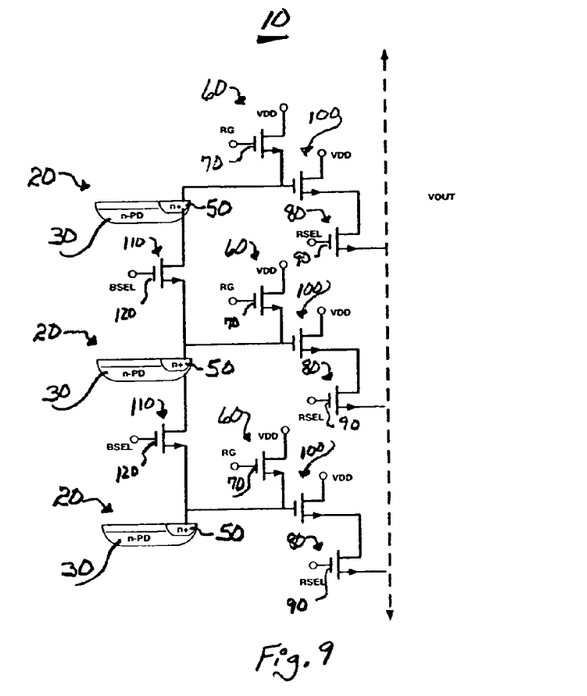
FIG. 9 is a schematic drawing of a third embodiment of the present invention illustrating a four-transistor pixel that provides programmable conversion gain and binning by selective connection of photodetectors which also operate as charge-to-voltage conversion regions in the vertical direction.
Figure 10:
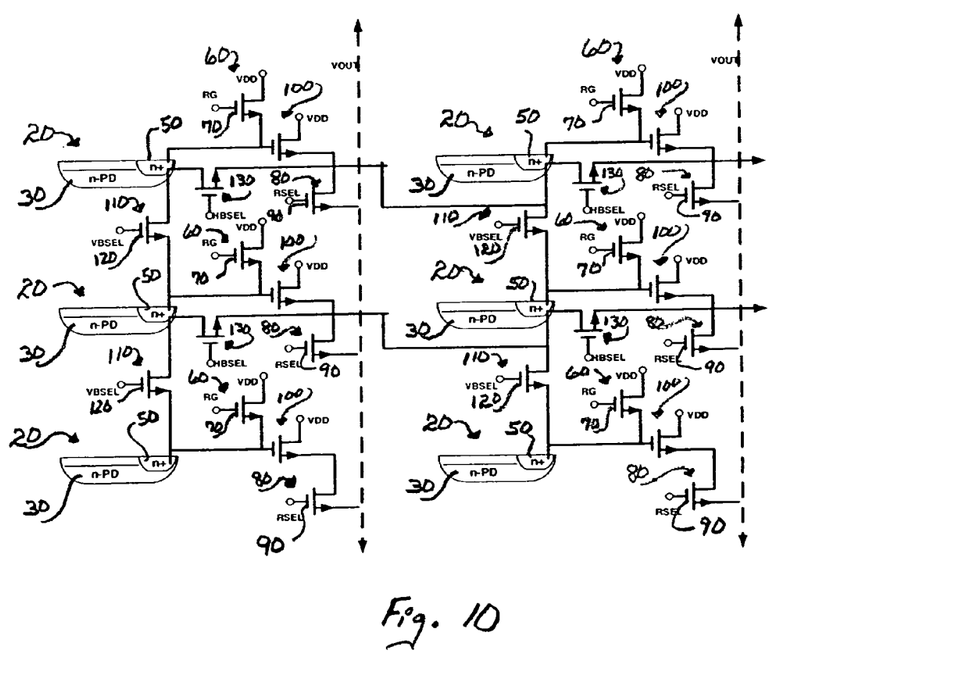
FIG. 10 is a schematic drawing of a fourth embodiment of the present invention illustrating a four-transistor pixel that provides programmable conversion gain and binning by selective connection of photodetectors which also operate as charge-to-voltage conversion regions in the vertical and horizontal direction.

The examples shown so far pertain to four transistor pixels that enable true correlated double sampling (CDS). FIGS. 9 and 10 respectively illustrate the same concept applied to a three transistor (3T) pixel as in FIGS. 4 and 5. In this case, the BSEL transistor 110 is connected between photodiodes 30 in adjacent rows. The resulting pixel is now a four transistor (4T). Otherwise operation is similar to that described for the pixels in FIGS. 4 and 5. For the pixels in FIGS. 9 and 10, the photodiode 30 also operates as the charge-to-voltage conversion node 50 or sense node 50.

It should be noted that the selection of how many pixels to connect with the BSEL (VBSEL) transistors 110 and 130 could be independent of the binning operation. For example, it may be desired to have three floating diffusions 50 connected to achieve adequate floating diffusion capacitance to hold the electrons stored in one photodiode 30. Now binning can be selectively employed or not employed in addition to the floating diffusion connection selection. In low light conditions, one may choose to "un-connect" adjacent pixels in order to reduce the sense node capacitance and increase the conversion gain in order to maximize the signal to noise ratio of the sensor in low light regions of the scene.

Figure 11:
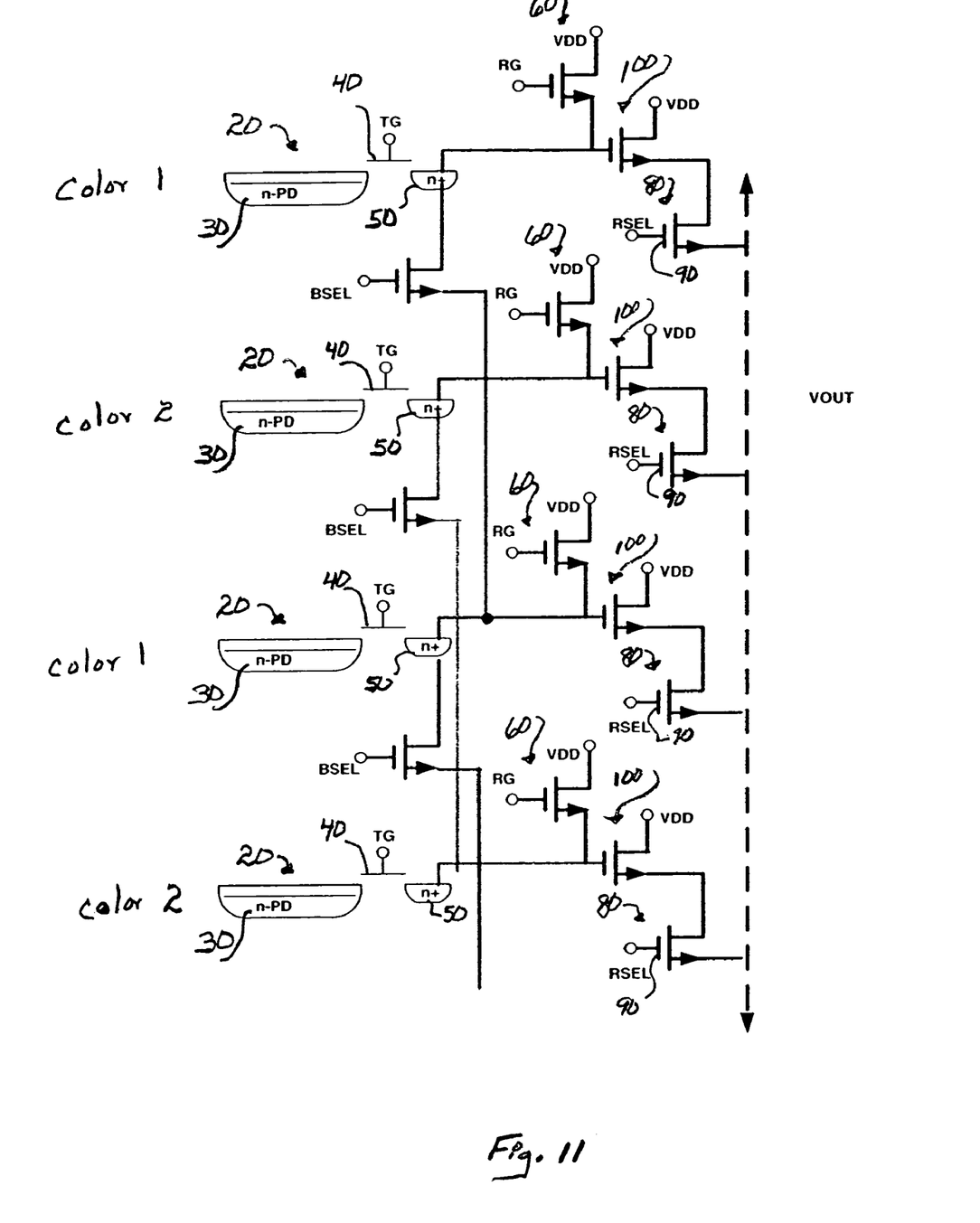
FIG. 11 is a schematic drawing of a fifth embodiment of the present invention illustrating a five-transistor pixel that provides programmable conversion gain and binning by selective connection of charge-to-voltage conversion regions for pixels with the same color filter in the vertical direction.

Another embodiment of this invention is shown in FIG. 11. The BSEL transistors 110 can be arrange to connect the adjacent pixels 20 of the same color filter pattern rather than the physically adjacent pixels. For example, colors 1 are connected together and colors 2 are connected together.

Figure 12:
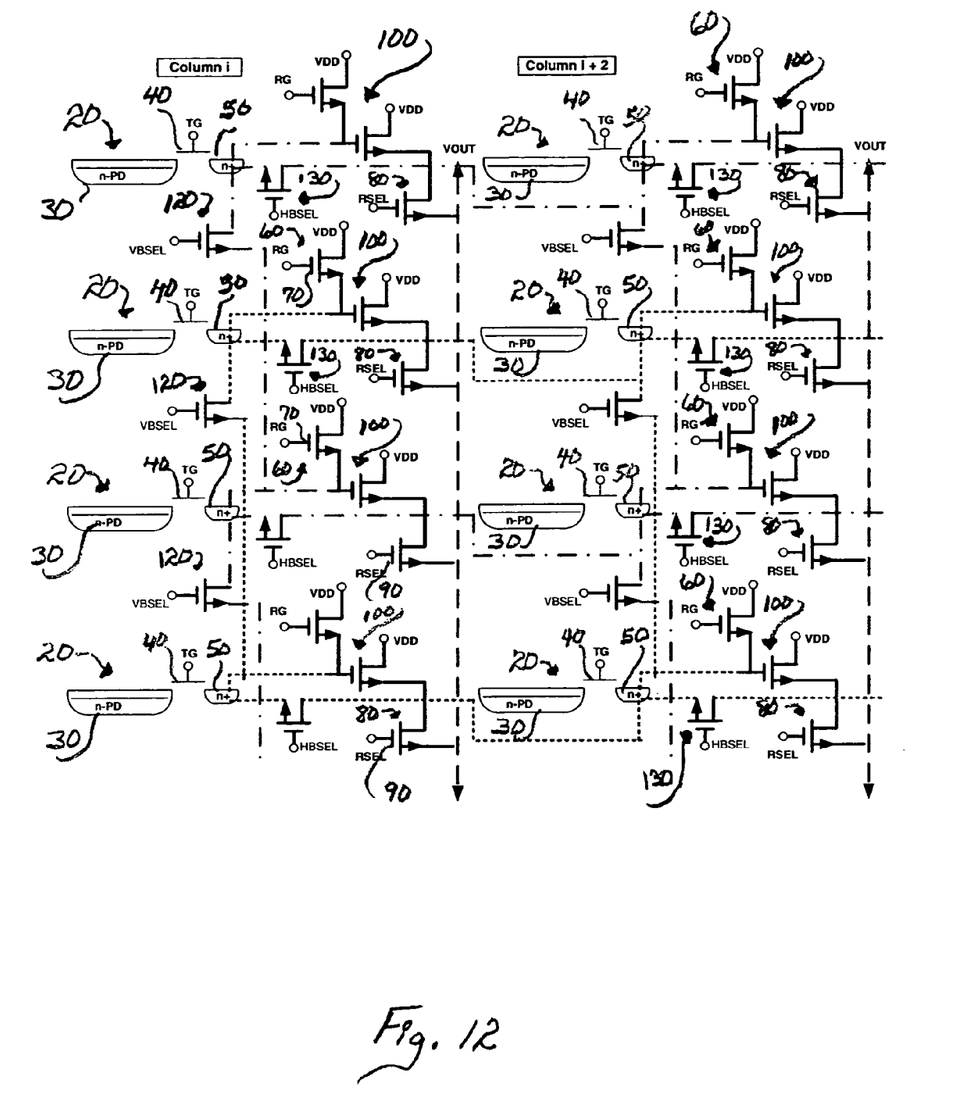
FIG. 12 is a is a schematic drawing of a fifth embodiment of the present invention illustrating a six-transistor pixel that provides programmable conversion gain and binning by selective connection of charge-to-voltage conversion regions for pixels with the same color filter in the vertical and horizontal direction.

Another embodiment of this invention is shown in FIG. 12. This is similar to the embodiment shown in FIG. 11 with the added feature that selective addressing of the vertical BSEL (VBSEL) transistors and horizontal BSEL (HBSEL) transistors can be done to connect both row and column adjacent pixels of the same color filter pattern.

Figure 13:
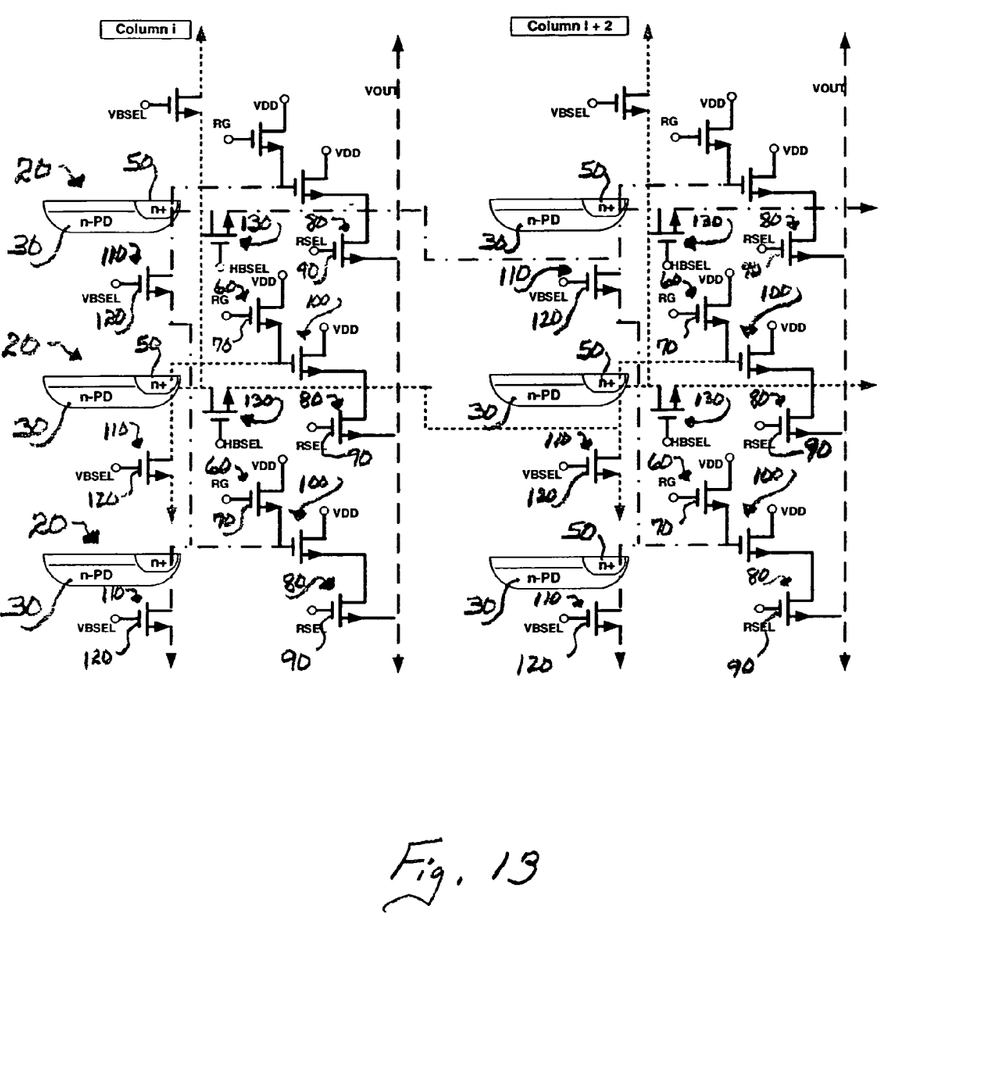
FIG. 13 is a schematic drawing of a sixth embodiment of the present invention illustrating a five-transistor pixel that provides programmable conversion gain and binning by selective connection photodetectors that operate as charge-to-voltage conversion regions for pixels with the same color filter in the vertical and horizontal direction.

Another embodiment of this invention is shown in FIG. 13. This is similar to the embodiment shown in FIG. 12 except the photodetector also operates as the floating diffusion and charge-to-voltage conversion region.

Figure 14:
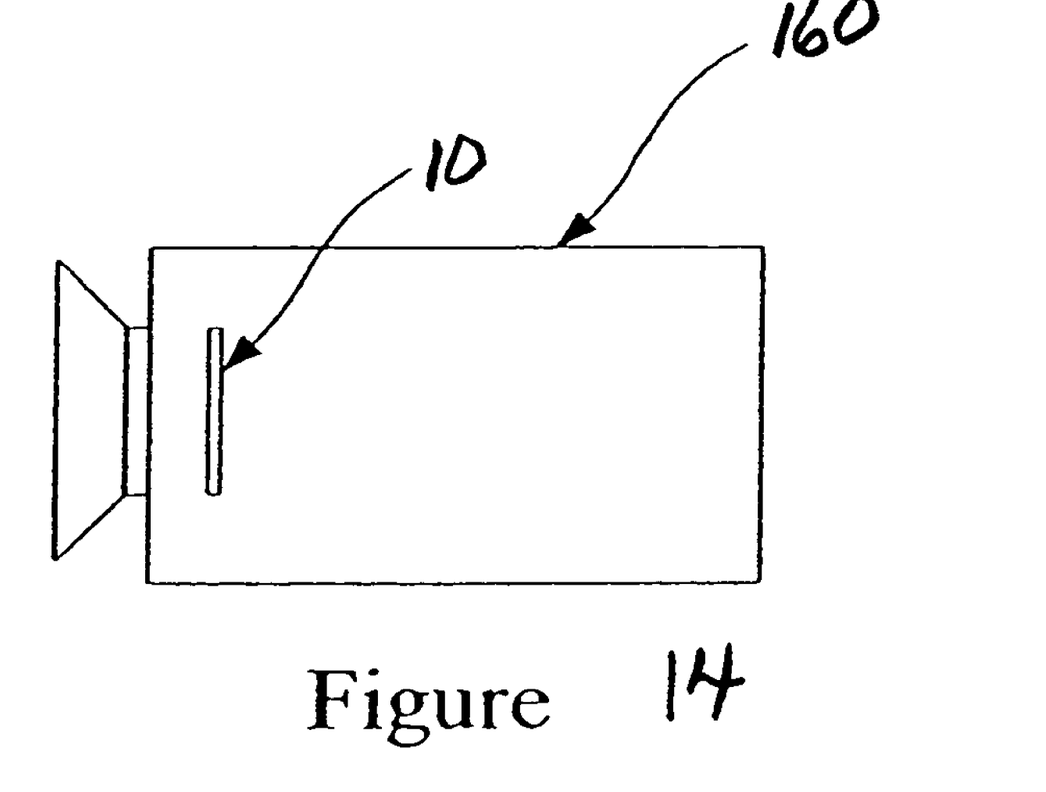
FIG. 14 is a digital camera illustrating a typical commercial embodiment for the image sensor of the present invention.

FIG. 14 is a digital camera 160 containing the image sensor 10 of the present invention for illustrating a typical embodiment to which the ordinary consumer is accustomed.

The invention has been described with reference to a preferred embodiment. However, it will be appreciated that variations and modifications can be effected by a person of ordinary skill in the art without departing from the scope of the invention.

PARTS LIST 10 image sensor
20 pixel
30 photodetector/photodiode
40 transfer gate
50 floating diffusion
60 reset transistor
70 reset gate
80 row select transistor
90 row select gate
100 source follower input transistor
110 "bin select" transistor (BSEL)
120 bin select gate or vertical bin selection transistor (VBSEL)
130 horizontal bin selection transistor (HBSEL)
160 digital camera

The invention claimed is:

1. An image sensor comprising:
    a plurality of pixels, including at least two pixels each comprising:
        (a) a photodetector for collecting charge;
        (b) a floating diffusion region associated with the photodetector;
        (c) a charge transfer gate for transferring charge from the photodetector to the floating diffusion region; and
        (d) an amplifier connected to the floating diffusion region; and
    at least one switch connected to the floating diffusion regions in at least two pixels for selectively connecting together only the floating diffusion regions in the at least two pixels to combine the charge on the connected floating diffusion regions.

2. The image sensor as in claim 1, wherein each floating diffusion region is integrally formed as a portion of the photodetector.

3. The image sensor as in claim 2, wherein the photodetector is a photodiode.

4. The image sensor as in claim 2, wherein the plurality of pixels are arranged in rows and columns and the switch selectively connects floating diffusion regions of row adjacent pixels.

5. The image sensor as in claim 2, wherein the plurality of pixels are arranged in rows and columns and the switch selectively connects floating diffusion regions of column adjacent pixels.

6. The image sensor as in claim 2, wherein the plurality of pixels are arranged in rows and columns and the switch selectively connects floating diffusion regions of row and column adjacent pixels.

7. The image sensor as in claim 2 further comprising a color filter array spanning the plurality of pixels and the switch selectively connects floating diffusion regions of adjacent pixels covered by the same color of the color filter array.

8. The image sensor as in claim 1, wherein the switch is a transistor.

9. The image sensor as in claim 8, wherein the transistor is a NMOS transistor.

10. The image sensor as in claim 1, wherein the plurality of pixels are arranged in rows and columns and the switch selectively connects floating diffusion regions of row adjacent pixels.

11. The image sensor as in claim 1, wherein the plurality of pixels are arranged in rows and columns and the switch selectively connects floating diffusion regions of column adjacent pixels.

12. The image sensor as in claim 1, wherein the plurality of pixels are arranged in rows and columns and the switch selectively connects floating diffusion regions of row and column adjacent pixels.

13. The image sensor as in claim 1 further comprising a color filter array spanning the plurality of pixels and the switch selectively connects floating diffusion regions of adjacent pixels covered by the same color of the color filter array.

14. The image sensor as in claim 1, wherein the switch functions as either all or any combination of providing a desired capacitance for the floating diffusion regions or providing a means of combining charge from adjacent photodetectors.

15. The image sensor as in claim 1, wherein the switch functions to provide a desired capacitance for the connected floating diffusion regions.

16. The image sensor as in claim 1, wherein the switch functions to provide a means of combining charge from adjacent photodetectors.

17. A camera comprising:
    an image sensor comprising:
    a plurality of pixels, including at least two pixels each comprising:
        (a) a photodetector for collecting charge;
        (b) a floating diffusion region associated with the photodetector;
        (c) a charge transfer gate for transferring charge from the photodetector to the floating diffusion region; and
        (d) an amplifier connected to the floating diffusion region; and
    at least one switch connected to the floating diffusion regions in at least two pixels for selectively connecting together only the floating diffusion regions in the at least two pixels to combine the charge on the connected floating diffusion regions.

18. The camera as in claim 17, wherein each charge-to-voltage conversion region is integrally formed as a portion of the photodetector.

19. The camera as in claim 18, wherein the photodetector is a photodiode.

20. The camera as in claim 18, wherein the plurality of pixels are arranged in rows and columns and the switch selectively connects floating diffusion regions of row adjacent pixels.

21. The camera as in claim 18, wherein the plurality of pixels are arranged in rows and columns and the switch selectively connects floating diffusion regions of column adjacent pixels.

22. The camera as in claim 18, wherein the plurality of pixels are arranged in rows and columns and the switch selectively connects floating diffusion regions of row and column adjacent pixels.

23. The camera as in claim 18 further comprising a color filter array spanning the plurality of pixels and the switch selectively connects floating diffusion regions of adjacent pixels covered by the same color of the color filter array.

24. The camera as in claim 17, wherein the switch is a transistor.

25. The camera as in claim 24 wherein the transistor is an NMOS transistor.

26. The camera as in claim 17, wherein the plurality of pixels are arranged in rows and columns and the switch selectively connects floating diffusion regions of row adjacent pixels.

27. The camera as in claim 17, wherein the plurality of pixels are arranged in rows and columns and the switch selectively connects floating diffusion regions of column adjacent pixels.

28. The camera as in claim 17, wherein the plurality of pixels are arranged in rows and columns and the switch selectively connects floating diffusion regions of row and column adjacent pixels.

29. The camera as in claim 17 further comprising a color filter array spanning the plurality of pixels and the switch selectively connects floating diffusion regions of adjacent pixels covered by the same color of the color filter array.

30. The camera as in claim 17, wherein the switch functions as either all or any combination of providing a desired capacitance for the floating diffusion regions or providing a means of combining charge from adjacent photodetectors.

31. The camera as in claim 17, wherein the switch functions to provide a desired capacitance for the connected floating diffusion regions.

32. The camera as in claim 17, wherein the switch functions to provide a means of combining charge from adjacent photodetectors.

33. A method for operating an image sensor comprising a plurality of pixels with at least two pixels each including a photodetector for collecting charge, a floating diffusion region associated with the photodetector; and a charge transfer gate for transferring charge from the photodetector to the floating diffusion region, and at least one switch connected to the floating diffusion regions in at least two pixels for selectively connecting together only the floating diffusion regions in the at least two pixels, the method comprising:
  activating at least one switch to selectively connect together multiple floating diffusion regions to combine the charge on the multiple floating diffusion regions;
  resetting the multiple floating diffusion regions to a predetermined voltage level;
  sampling a reset voltage on the connected multiple charge to voltage conversion regions;
  enabling at least one transfer gate to transfer charge from at least one photodetector to the connected multiple floating diffusion regions;
  disabling the at least one transfer gate; and
  sampling a signal voltage on the multiple floating diffusion regions.

* * * * *